United States Patent
Chandrachood et al.

(10) Patent No.: US 7,520,999 B2
(45) Date of Patent: *Apr. 21, 2009

(54) METHOD OF PROCESSING A WORKPIECE IN A PLASMA REACTOR WITH DYNAMIC ADJUSTMENT OF THE PLASMA SOURCE POWER APPLICATOR AND THE WORKPIECE RELATIVE TO ONE ANOTHER

(75) Inventors: Madhavi R. Chandrachood, Sunnyvale, CA (US); Richard Lewington, Hayward, CA (US); Darin Bivens, San Mateo, CA (US); Ajay Kumar, Cupertino, CA (US); Ibrahim M. Ibrahim, Santa Clara, CA (US); Michael N. Grimbergen, Redwood City, CA (US); Renee Koch, Brentwood, CA (US); Sheeba J. Panayil, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 341 days.

This patent is subject to a terminal disclaimer.

(21) Appl. No.: 11/416,744

(22) Filed: May 3, 2006

(65) Prior Publication Data

US 2007/0257008 A1    Nov. 8, 2007

(51) Int. Cl.
*B44C 1/22* (2006.01)
*H01L 21/00* (2006.01)

(52) U.S. Cl. ............................ 216/58; 216/59; 216/67; 438/706; 438/710

(58) Field of Classification Search .................. 216/58, 216/67; 438/706, 710
See application file for complete search history.

(56) References Cited

U.S. PATENT DOCUMENTS

| 4,512,841 | A | 4/1985 | Cunningham et al. .. 156/345.43 |
| 5,110,407 | A | 5/1992 | Ono et al. .................... 438/696 |
| 5,888,413 | A | 3/1999 | Okumura et al. .............. 216/68 |
| 5,975,013 | A | 11/1999 | Holland et al. |
| 6,054,013 | A | 4/2000 | Collins et al. .......... 156/345.27 |
| 6,229,264 | B1 | 5/2001 | Ni et al. ................. 315/111.51 |
| 6,414,648 | B1 | 7/2002 | Holland et al. .............. 343/895 |
| 2003/0044529 | A1* | 3/2003 | Wu et al. .................... 427/240 |
| 2007/0256784 | A1 | 11/2007 | Chandrachood et al. .... 118/729 |
| 2007/0256787 | A1 | 11/2007 | Chandrachood et al. ...................... 156/345.48 |
| 2007/0257008 | A1 | 11/2007 | Chandrachood et al. ...... 216/67 |

* cited by examiner

*Primary Examiner*—Shamim Ahmed
(74) *Attorney, Agent, or Firm*—Law Office of Robert M. Wallace (57) ABSTRACT

A method for processing a workpiece in a plasma reactor chamber by applying RF source power to inner and outer source power applicators, and introducing a process gas into the reactor while rotating at least one of (a) the workpiece, (b) the outer source power applicator, about a radial tilt axis to a position at which the plasma distribution is nearly symmetrical, and translating the inner source power applicator relative to the outer source power applicator along the axis of symmetry to a location at which the spatial distribution is nearly uniform.

20 Claims, 7 Drawing Sheets

METHOD OF PROCESSING A WORKPIECE IN A PLASMA REACTOR WITH DYNAMIC ADJUSTMENT OF THE PLASMA SOURCE POWER APPLICATOR AND THE WORKPIECE RELATIVE TO ONE ANOTHER

BACKGROUND OF THE INVENTION

In semiconductor device fabrication involving plasma processing to form nanometer-scale feature sizes across a large workpiece, a fundamental problem has been plasma uniformity. For example, the workpiece may be a 300 mm semiconductor wafer or a rectangular quartz mask (e.g., 152.4 mm by 152.4 mm), so that maintaining a uniform etch rate relative to nanometer-sized features across the entire area of a 300 mm diameter wafer (for example) is extremely difficult. The difficulty arises at least in part from the complexity of the process. A plasma-enhanced etch process typically involves simultaneous competing processes of deposition and etching. These processes are affected by the process gas composition, the chamber pressure, the plasma source power level (which primarily determines plasma ion density and dissociation), the plasma bias power level (which primarily determines ion bombardment energy at the workpiece surface), wafer temperature and the process gas flow pattern across the surface of the workpiece. The distribution of plasma ion density, which affects process uniformity and etch rate distribution, is itself affected by RF characteristics of the reactor chamber, such as the distribution of conductive elements, the distribution of reactances (particularly capacitances to ground) throughout the chamber, and the uniformity of gas flow to the vacuum pump. The latter poses a particular challenge because typically the vacuum pump is located at one particular location at the bottom of the pumping annulus, this location not being symmetrical relative to the either the workpiece or the chamber. All these elements involve asymmetries relative to the workpiece and the cylindrically symmetrical chamber, so that such key parameters as plasma ion distribution and/or etch rate distribution tend to be highly asymmetrical.

The problem with such asymmetries is that conventional control features for adjusting the distribution of plasma etch rate (or deposition rate) across the surface of the workpiece are capable of making adjustments or corrections that are symmetrical relative to the cylindrical chamber or the workpiece or the workpiece support. (Examples of such conventional features include independently driven radially inner and outer source-power driven coils, independently supplied radially inner and outer gas injection orifice arrays in the ceiling, and the like.) Such features are, typically, incapable of completely correcting for non-uniform distribution of plasma ion density or correcting for a non-uniform distribution of etch rate across the workpiece (for example). The reason is that in practical application, such non-uniformities are asymmetrical (non-symmetrical) relative to the workpiece or to the reactor chamber.

There is, therefore, a need to enable conventional control features for adjusting distribution of plasma process parameters (e.g., distribution across the workpiece of either etch rate, or etch microloading, or plasma ion density, or the like) to correct the type of asymmetrical or non-symmetrical non-uniformities that are encountered in actual plasma process environments.

SUMMARY OF THE INVENTION

A method for processing a workpiece in a plasma reactor chamber having radially inner and outer source power applicators at a ceiling of the chamber facing the workpiece, the inner and outer source power applicators and the workpiece sharing a common axis of symmetry. The method includes applying RF source power to the source power applicators, and introducing a process gas into the reactor chamber so as to carry out a plasma process on the workpiece characterized by a plasma process parameter, the plasma process parameter having a spatial distribution across the surface of the workpiece. The method further includes rotating at least one of (a) the workpiece, (b) the outer source power applicator, about a radial tilt axis to a position at which the spatial distribution of the plasma process parameter has at least a nearly minimal non-symmetry relative to the common axis of symmetry, and translating the inner source power applicator relative to the outer source power applicator along the axis of symmetry to a location at which the spatial distribution has at least a nearly minimal non-uniformity across the surface of the workpiece.

DETAILED DESCRIPTION OF THE INVENTION

The present invention is based upon the inventors' discovery that spatial distribution across the workpiece surface of a plasma process parameter (such as etch rate) may be transformed from an asymmetrical distribution (relative to the workpiece or to the chamber) to a more symmetrical distribution. Following such a transformation, the distribution (e.g., etch rate distribution) readily may be corrected to a uniform (or nearly uniform) distribution by employing adjustment features that operate symmetrically relative to the workpiece or relative to the chamber. In a preferred embodiment, the spatial distribution of etch rate (for example) across the workpiece is transformed from an asymmetrical distribution to a symmetrical one by tilting an overhead plasma source power applicator relative to the workpiece at such an angle that the etch rate distribution becomes symmetrical with respect to the cylindrical symmetry of the chamber or of the workpiece. For example, the etch rate, which was initially distributed in a non-symmetrical fashion, may be transformed to a center-high or center-low etch rate distribution across the workpiece. The resulting center-high or center-low etch rate distribution is then rendered perfectly uniform (or nearly uniform) by adjusting an inner portion of the overhead source power applicator relative to an outer portion of the overhead source power applicator. In a preferred embodiment, the source power applicator is an inductively coupled source power applicator consisting of (at least) a radially inner symmetrically wound conductor coil and a radially outer symmetrically wound conductor coil concentric with the inner coil. In one implementation, the adjustment of the inner coil relative to outer coil is performed by adjusting the different heights of the inner and outer coils relative to the workpiece.

Figure 1:
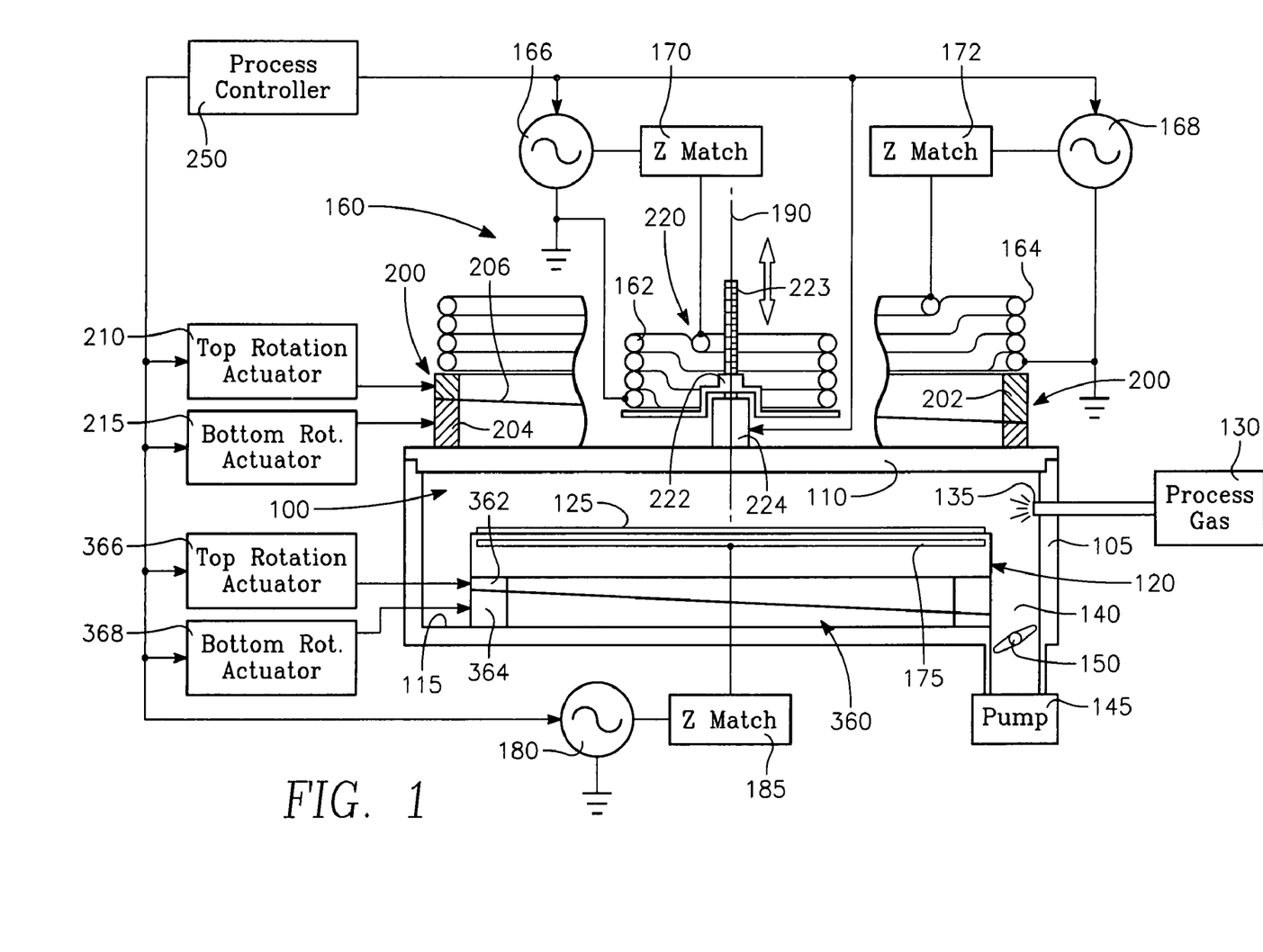
FIG. 1 depicts a reactor of a first preferred embodiment.

Referring to FIG. 1, a plasma reactor for processing a workpiece consists of a vacuum chamber 100 defined by a cylindrical side wall 105, a ceiling 110 and a floor 115. A workpiece support pedestal 120 on the floor 115 can hold a workpiece 125 that is either a semiconductor wafer or a quartz mask (for example). A process gas supply 130 furnishes a process gas at a desired flow rate into the chamber 100 through gas injection devices 135 which may be provided either in the side wall 105 as shown or in the ceiling 110. A pumping annulus 140 is defined between the workpiece support pedestal 120 and the side wall 105, and gas is evacuated from the chamber 100 through the pumping annulus 140 by a vacuum pump 145 under the control of a throttle valve 150. Plasma RF source power is coupled to the gases inside the chamber 100 by an RF plasma source power applicator 160 overlying the ceiling 110. In the preferred embodiment illustrated in FIG. 1, the source power applicator 160 consists of an inner RF coil or helical conductor winding 162 and an outer RF coil or helical conductor winding 164, driven by respective RF source power generators 166, 168 through respective impedance matches 170, 172. RF plasma bias power is coupled to the plasma by an electrode or conductive grid 175 inside the workpiece support pedestal 120 with bias power applied by an RF bias power generator 180 through an impedance match 185.

In order to adjust the distribution of plasma process non-uniformities across the surface of the workpiece 125, the outer coil 164 can be rotated (tilted) about any selected radial axis (i.e., an axis extending through and perpendicular to the chamber's cylindrical or vertical axis of symmetry 190). As one advantage of this feature, we have discovered that such a rotation (or "tilt") of the outer coil 164, if performed about an optimum radial axis and through an optimum angle, will transform a non-symmetrical non-uniform spatial distribution of a plasma process parameter (e.g., etch rate) to a symmetrical non-uniform distribution (i.e., symmetrical about the vertical or cylindrical axis of symmetry 190). The "optimum" radial axis and the "optimum" angle for this tilt rotation depends upon the individual characteristics of the particular reactor chamber, among other things, and are determined empirically prior to processing of a production workpiece, e.g., by trial and error testing.

Once the etch rate distribution is rendered symmetrical in this manner, its non-uniformities are readily corrected by adjusting the effect of the inner coil 162 relative to the outer coil 164. In a preferred embodiment, this adjustment can be made by changing the height above the ceiling of one of the coils 162, 164 relative to the other one. For this purpose, the inner coil 162 is translatable along the cylindrical axis of symmetry 190 relative to the outer coil 164 (and relative to the workpiece 125 and the entire chamber 100). If for example the etch rate distribution has been transformed from the typical non-symmetrical distribution to a symmetrical center-high distribution, then the non-uniformity is decreased (or eliminated) by translating the inner coil 162 vertically upward (away from the ceiling 110) to decrease plasma ion density over the center of the workpiece 125. Conversely, if for example the etch rate distribution has been transformed from the typical non-symmetrical distribution to a symmetrical center-low distribution, then this non-uniformity is decreased (or eliminated) by translating the inner coil 162 vertically downward (toward the ceiling 110) to increase plasma ion density over the center of the workpiece 125.

In an alternative embodiment, adjustment of the effect of the inner coil 162 relative to the outer coil can be made by adjusting the relative RF power levels applied to the different coils 162, 164. This can be in addition to or in lieu of vertical translation of the inner coil 162.

Figure 2A:
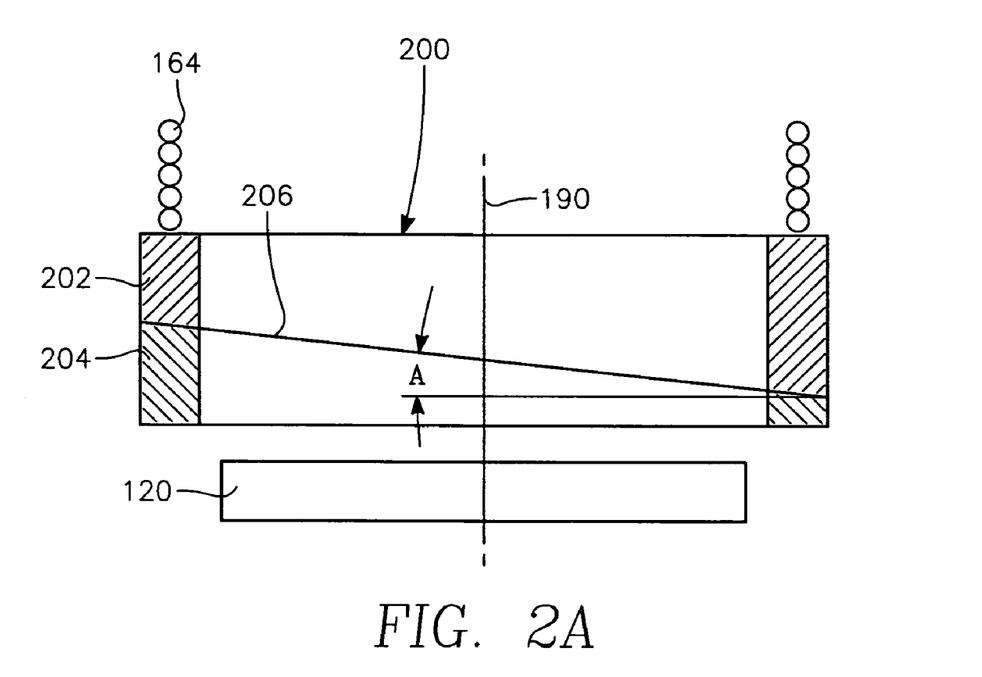
FIGS. 2A and 2B depict the operation of a tilt adjustment mechanism in the embodiment of FIG. 1.
Figure 2B:
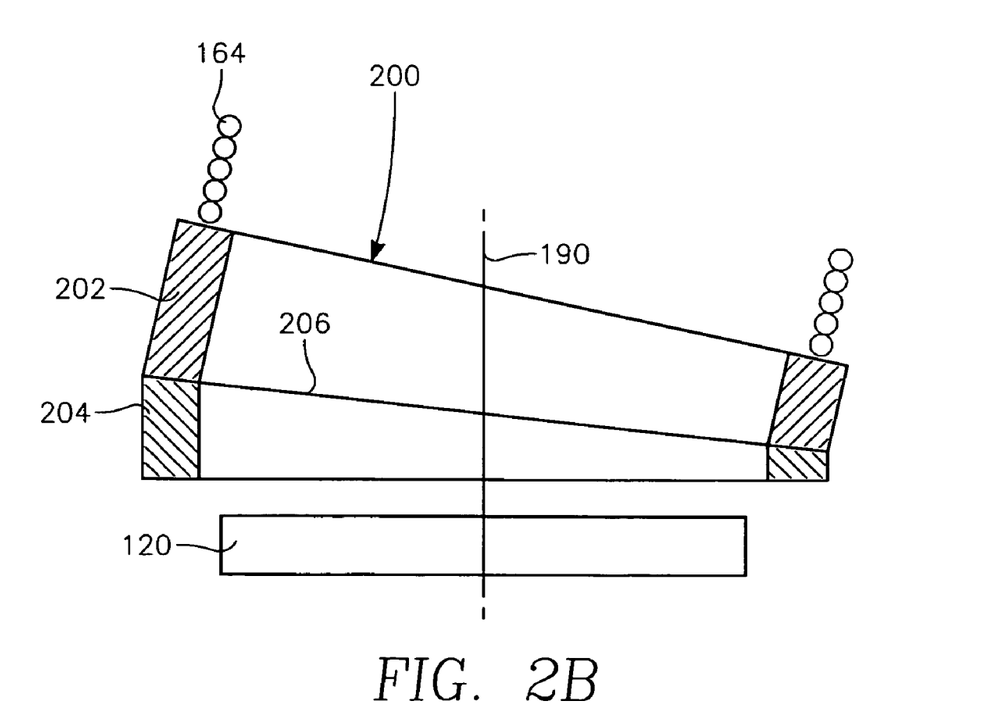

In the preferred embodiment, the tilt rotation of the outer coil 164 is performed with very fine control over extremely small rotation angles by a pair of eccentric rings 200, namely a top ring 202 and a bottom ring 204, best shown in FIGS. 2A and 2B. The outer coil 164 is supported by the top ring 202 and (preferably) rotates with the top ring 202. The upper and lower rings 202, 204 may be thought of as having been formed from a single annular ring which has been sliced in a plane 206 that is slanted at some angle "A" relative to the horizontal. As one of the two rings 202, 204 is rotated relative to the other about the cylindrical axis 190, the top surface of the top ring 202 tilts from the initial level orientation of FIG. 2A to the maximum rotation of FIG. 2B. For this purpose, the two rings 202, 204 are rotated independently of one another about the cylindrical axis 190 by respective top and bottom rotation actuators 210, 215. Either ring 202, 204 may be rotated in either direction (clockwise, counter-clockwise) about the axis 190 while the other ring is held still. Or, the two rings may be rotated simultaneously in opposite rotational directions for the fastest change in tilt angle. Also, in order to adjust the orientation of the tilt direction, the two rings 202, 204 may be rotated simultaneously in unison by the actuators 210, 215 either before or after a desired tilt angle is established. Thus, a typical sequence may be to establish a desired tilt angle by rotating the rings 202, 204 in opposite rotational directions until the desired tilt angle is reached, and then establishing the azimuthal direction of the tilt angle (e.g., "north", "south", "east" or "west" or any direction therebetween) by rotating the rings 202, 204 simultaneously in unison—or non-simultaneously—in the same rotational direction until the tilt direction is oriented as desired.

While in the preferred embodiment of FIG. 1 only the outer coil 164 is coupled to the top ring 202, in an alternative embodiment both the inner and outer coils 162, 164 are coupled to the top ring 202 so as to be tilted by the tilt actuators 210, 215.

The axial (vertical) translation (up or down) of the inner coil 162 is performed by a mechanical actuator, such as the screw-drive actuator 220 that is depicted in FIG. 1. The screw drive actuator 220 may be formed of non-conducting material and may consist of a threaded female rider 222 coupled to the inner coil 162 and a rotatable threaded screw 223 threadably engaged with the rider 222. The screw 223 is rotated clockwise and/or counter-clockwise by a vertical translation motor 224. Alternatively, the actuator 220 may be mounted on support structure overlying the coil 162 (not shown).

In an alternative (but not preferred) embodiment, the top ring 202 supports both the inner and outer coils 162, 164, so that the inner and outer coils 162, 164 tilt simultaneously together.

Figure 3A:
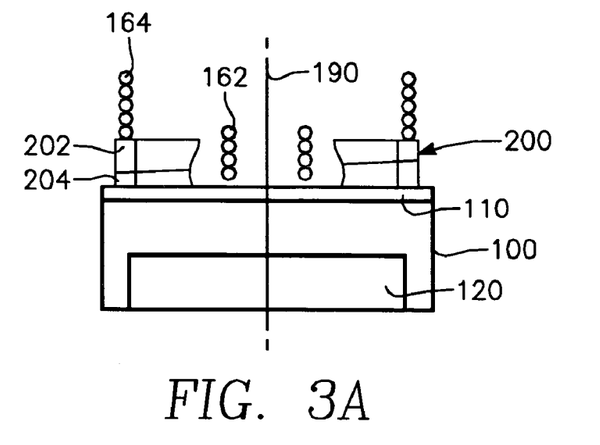
FIGS. 3A, 3B and 3C depict successive steps in the operation of the embodiment of FIG. 1.
Figure 3B:
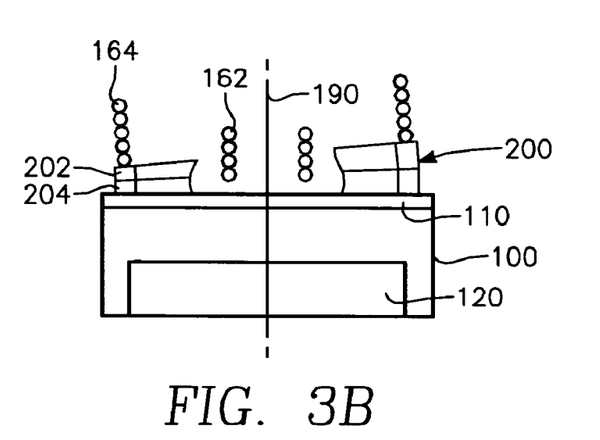
Figure 3C:
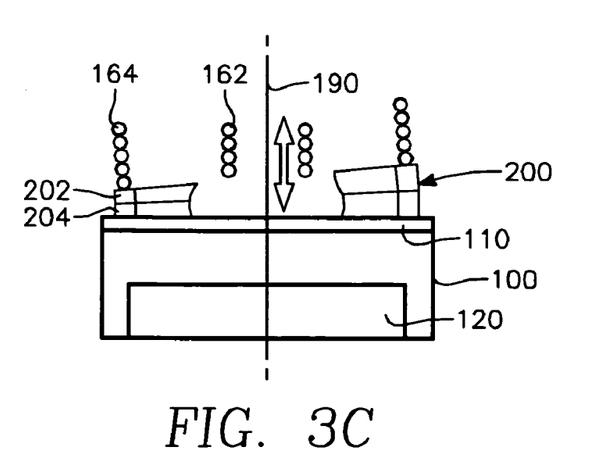
Figure 4A:
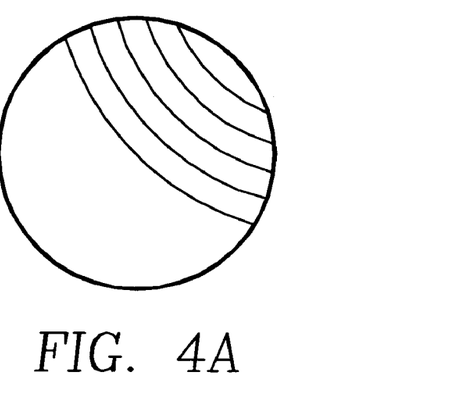
FIGS. 4A, 4B and 4C depict the etch rate distribution across the surface of a workpiece obtained in the respective steps of FIGS. 3A, 3B and 3C.

FIGS. 3A-3C and 4A-4C depict a basic process of the invention. Initially, the outer coil 164 is essentially level relative to the plane of the ceiling 110 and of the workpiece support 120, as depicted in FIG. 3A. The etch rate distribution tends to have a non-symmetrical pattern of non-uniformity, as depicted in FIG. 4A. The outer coil 164 is then tilted (FIG. 3B) about a particular radial axis by a particular angle that is sufficiently optimum to transform the non-symmetrical pattern of etch rate non-uniformities of FIG. 4A to the symmetrical distribution of non-uniformities of FIG. 4B. Such an axially symmetrical distribution (FIG. 4B) reflects an etch rate distribution that is either center-high or center-low (for example). This non-uniformity is reduced or eliminated to produce the perfectly uniform distribution of FIG. 4C by translating the inner coil 162 either up or down along the vertical axis 190, as indicated in FIG. 3C. Preferably, the inner coil 162 is not tilted with the outer coil 164. However, if both coils 162, 164 are tilted together, then the up/down translation of the inner coil 162 may be along a trajectory that is at a slight angle to the cylindrical axis 190.

In order to enable a versatile selection of all modes or combinations of all possible rotations of the top and bottom rings 162, 164 (i.e, for tilting and/or rotation about the cylindrical axis of the outer coil 164) and the vertical translation of the inner coil 162, a process controller 250 independently controls each of the rotation actuators 210, 215 and the translation actuator 220, as well as the RF generators 166, 168, 180.

Figure 5:
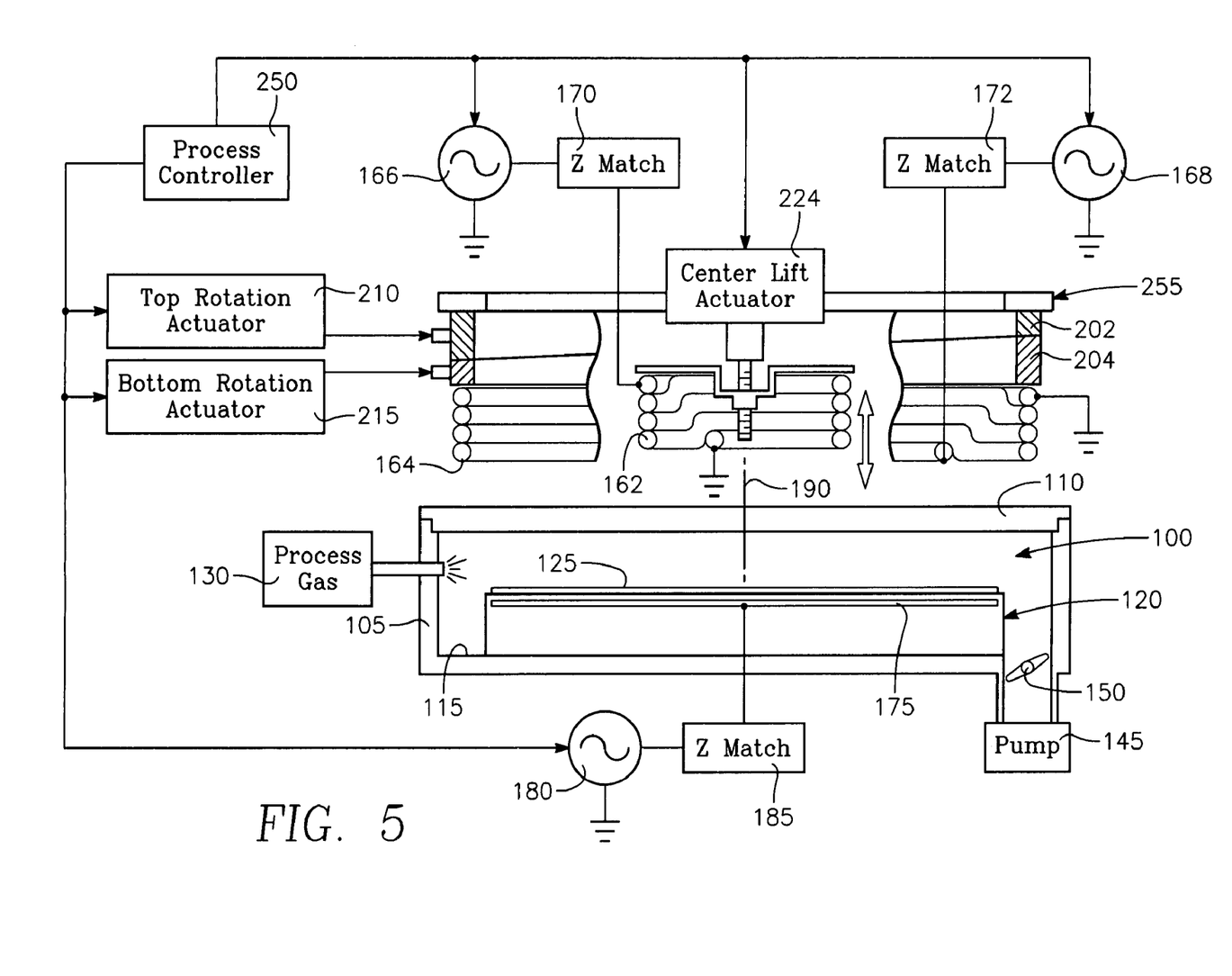
FIG. 5 depicts a reactor of a second preferred embodiment.

FIG. 5 depicts another alternative embodiment in which the outer coil 164 is suspended from the bottom of a support 255 coupled to the top ring 202 (rather than resting on the top ring 202 as in FIG. 1).

Figure 6:
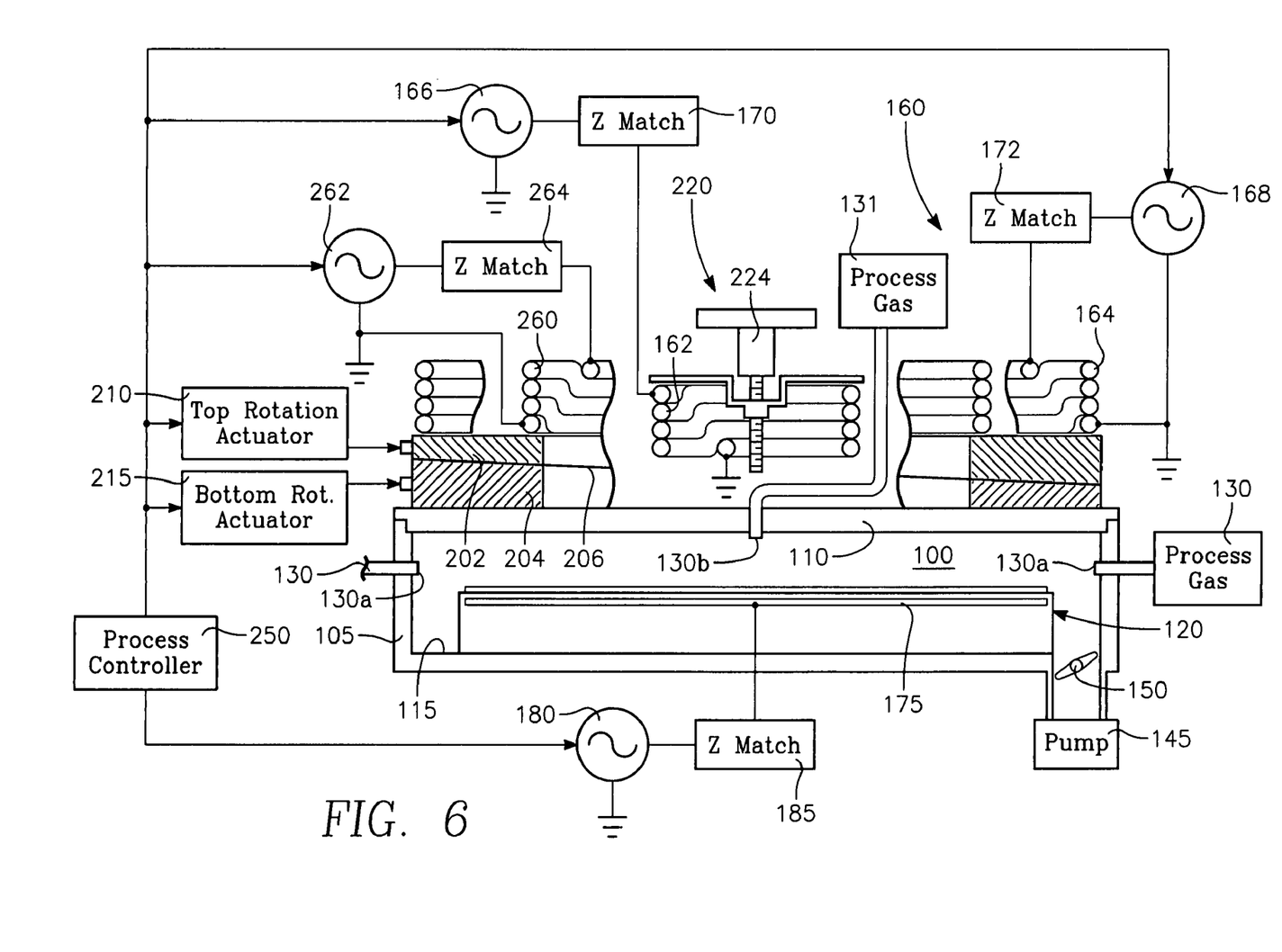
FIG. 6 depicts a reactor in accordance with an alternative embodiment.

FIG. 6 depicts another embodiment in which an intermediate coil 260 is introduced that lies between the inner and outer coils 162, 164, the intermediate coil being independently driven by an RF source power generator 262 through an impedance match 264. This embodiment may be employed in carrying out certain steps in a process of the invention in which each of the three coils 162, 164, 260 are driven with different RF phases (and possible the same RF frequency) to set up different maxima and minima in the RF power density distribution in the plasma generation region. This in turn is reflected in different patterns in etch rate distribution across the surface of the workpiece 125. For example, the intermediate coil 260 may be driven 180 degrees out of phase from the inner and outer coils 162, 164.

Returning now to FIG. 1, while the preferred embodiments have been described with reference to apparatus and methods in which the outer coil 164 (at least) is rotated ("tilted") about a radial axis relative to the workpiece 125 and relative to the entire chamber 100, the converse operation could be performed to achieve similar results. Specifically, the workpiece 125 and workpiece support 120 could be tilted relative to the source power applicator 160 (and relative to the entire chamber 100) rather than (or in addition to) tilting the outer coil 164. For this purpose, a pair of concentric eccentric rings 360 (identical to the rings 162, 164 of FIG. 1), consisting of a top ring 362 and a bottom ring 364, are provided under and supporting the wafer support pedestal 120, so that the pedestal 120 can be tilted in the manner previously described with reference to the outer coil 164. Respective top and bottom actuators 366, 368 separately control rotation of the top and bottom rings 362, 364 about the cylindrical axis 190.

Figure 4B:
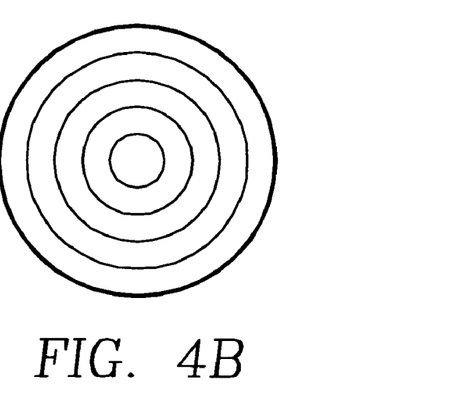
Figure 4C:
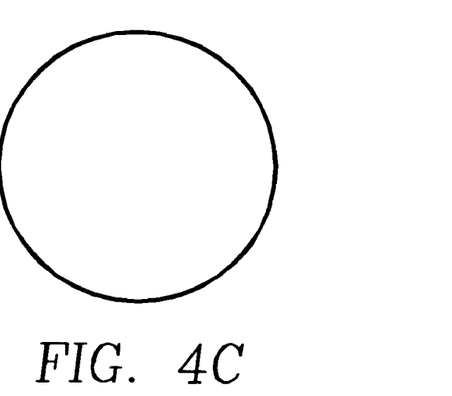
Figure 7:
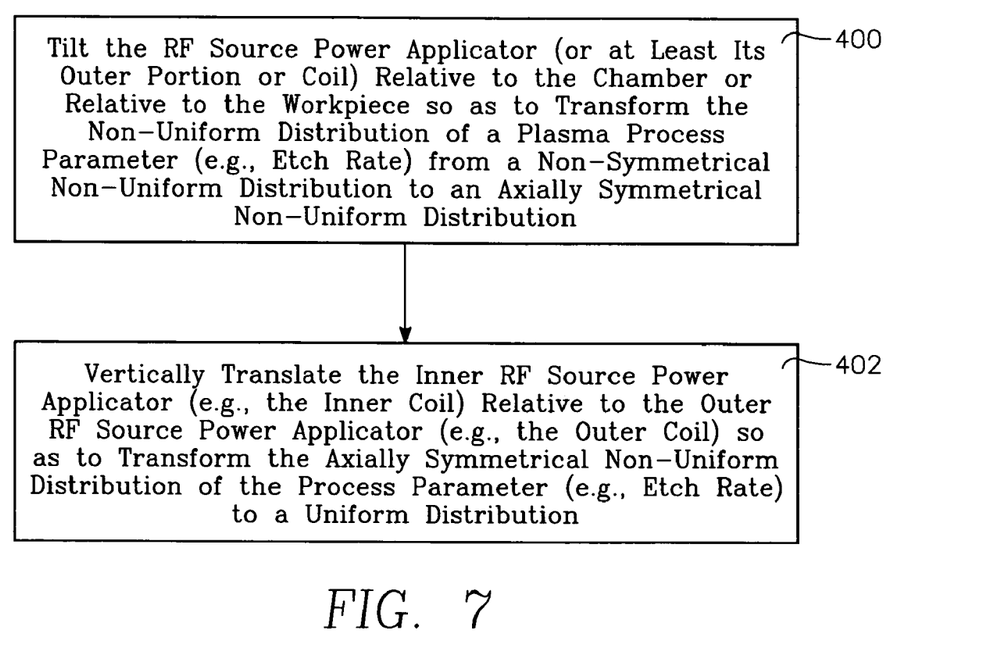
FIG. 7 is a block flow diagram depicting a first method of the invention.

FIG. 7 is a block flow diagram depicting a first method of the invention. The first step (block 400), is to tilt the RF source power applicator 160 (or at least its outer portion or coil 164) relative to the chamber 100 or relative to the workpiece 125 so as to transform the non-uniform distribution of a plasma process parameter (e.g., etch rate) from a non-symmetrical non-uniform distribution (FIG. 4A) to an axially symmetrical non-uniform distribution (FIG. 4B). The second step (block 402) is to vertically translate the inner RF source power applicator (e.g., the inner coil 162) relative to the outer RF source power applicator (e.g., the outer coil 164) or relative to the ceiling 110 or workpiece 125, so as to transform the axially symmetrical non-uniform distribution of the process parameter (e.g., etch rate) (FIG. 4B) to a uniform distribution (FIG. 4C).

Figure 8:
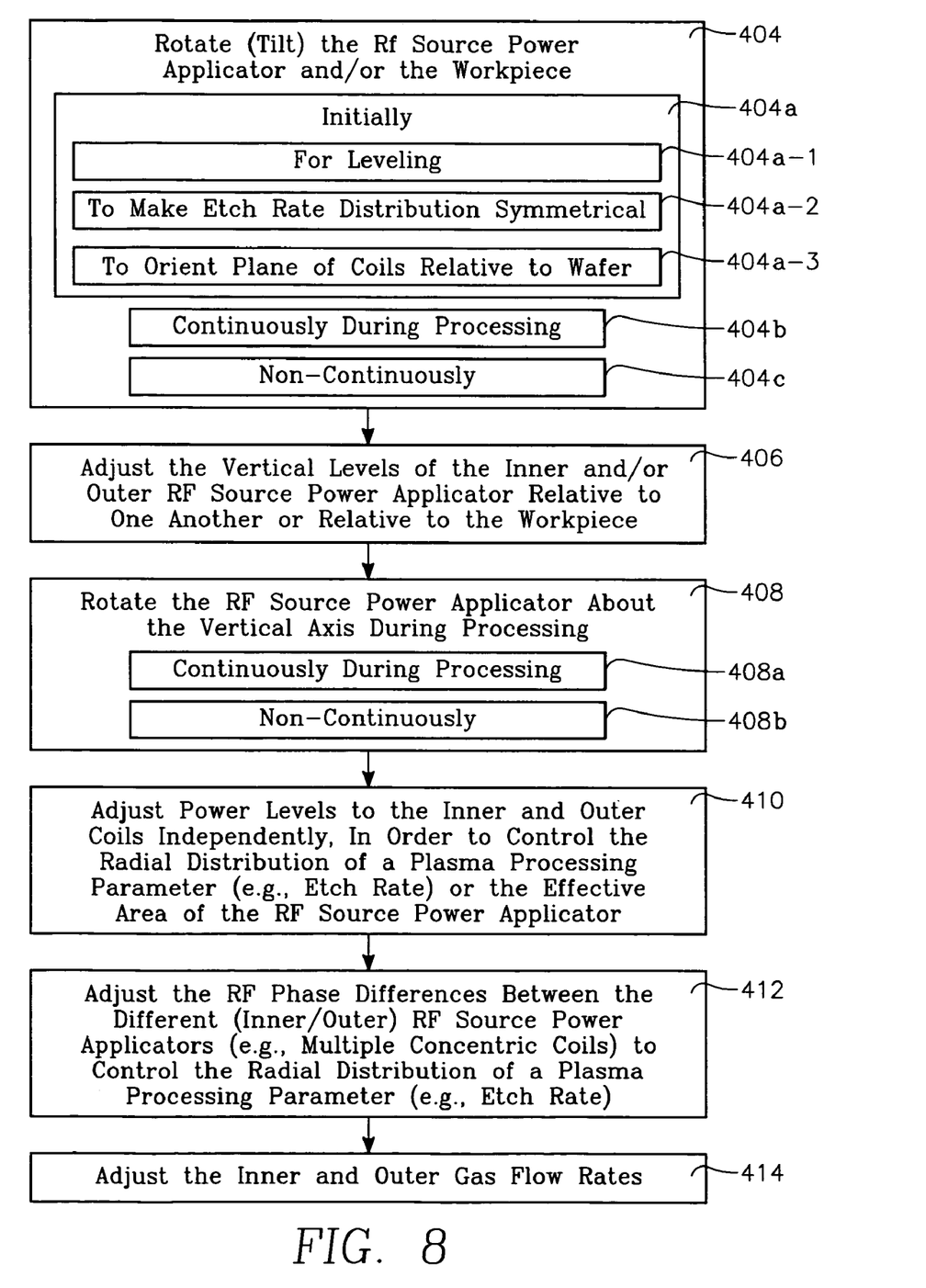
FIG. 8 is a block flow diagram depicting a second method of the invention.

FIG. 8 is a block flow diagram depicting another method of the invention that can subsume a number of different versions. The first step (block 404) is to rotate (tilt) the RF source power applicator 160 (or at least its outer coil 164) about a radial axis. In one version, this step is performed initially, i.e., prior to processing a production workpiece (block 404*a*). This step may be performed to level the source power applicator 160 (or outer coil 164) relative to a datum plane of the chamber 100 (block 404*a*-1). Or this step may be performed, as discussed previously in this specification, to make the etch rate distribution symmetrical (or at least nearly so) about the cylindrical axis 190 (block 404*a*-2). Or, this step may be performed to orient the plane of coil 164 relative to a plane of the workpiece 125 (block 404*a*-3). In another version, this step may be performed continuously during processing (block 404*b*). Alternatively, this step may be performed non-continuously or sporadically (block 404*c*).

In an alternative embodiment, the purpose of the step of block 404 is to tilt the plane of the source power applicator 160 (or at least its outer coil 164) relative to the plane of the workpiece 125, in which case either the coil 164 is tilted (using the rotation actuators 210, 215 of FIG. 1) or the workpiece support 120 is tilted (using the rotation actuators 366, 368). Or, it is possible to simultaneously tilt both the outer coil 164 and the workpiece support 120 until the desired relative orientation of the plane of one relative to the plane of the other one is achieved. As described above, the optimum orientation is one in which the distribution across the workpiece 125 of a plasma parameter such as etch rate is at least nearly symmetrical relative to the vertical axis of symmetry 190. This enables a symmetrical adjustment in plasma distribution to render the plasma process parameter distribution at least nearly uniform. Such a symmetrical adjustment may be a change in the relative heights of the inner and outer coils 162, 164, or a change in the relative RF power levels applied to the two coils, for example, or a change in respective process gas flow rates to the inner and outer portions of the process region overlying the workpiece 125. Such adjustments are carried out in some of the steps that are described below.

A next step is to adjust the vertical levels of the inner and/or outer RF source power applicators 162, 164 relative to one another or relative to the workpiece 125 (block 406). This step may be carried out for the purpose of transforming a cylindrically symmetrical non-uniform etch rate distribution across the workpiece 125 to a uniform distribution (or nearly uniform), as discussed above in this specification.

A next step is to rotate the RF source power applicator 160 (or at least its outer coil or portion 164) about the vertical axis during processing (block 408). As mentioned previously in this specification, such a step may be carried out by rotating the two eccentric rings 202, 204 simultaneously in unison. This step may be carried out continuously during processing (block 408*a*). Alternatively, this step may be carried out non-continuously or sporadically (block 408*b*), depending upon the desired effects during processing. Such a step may average out non-uniform effects of the source power applicator 160 across the surface of the workpiece 125 over a number of rotations during a given plasma process step. The rotation of the source power applicator 160 (or at least its outer portion 164) may be carried out before, during or after the tilting operation. The difference is that tilting requires relative rotational motion about the axis of symmetry 190 of the top and bottom rings 202, 204, whereas pure rotational motion about the axis of symmetry by the outer applicator portion 164 requires rotation in unison of the two rings 202, 204 with no relative motion between the two rings 202, 204. These two modes of motion may be performed simultaneously by combining the two types of relative ring motions. Although the outer applicator portion 164 may already be tilted so that its axis of symmetry does not coincide with the vertical axis 190, its rotational motion (when the rings 202, 204 rotate in unison) is nevertheless defined in this specification as occurring about the vertical axis 190.

A next step (block 410) may be to adjust the respective levels of RF power delivered to the inner and outer coils 162, 164 independently, in order to control the radial distribution of a plasma processing parameter (e.g., etch rate) or the effective area of the RF source power applicator 160. As one possible example, this step may be carried out to correct a symmetrical non-uniform etch rate distribution across the workpiece surface. As such, this step may be supplementary to (or in lieu of) the vertical translation of the inner coil 162 referred to above.

Another step (block 412) may be to adjust the RF phase differences between the different (inner/outer) source power applicator portions (e.g., multiple concentric coils 162, 164, 260 of FIG. 6) to control the radial distribution of a plasma processing parameter (e.g., etch rate). Different RF power distributions may be achieved with different phase relationships between the multiple coils, and some may be optimum for certain desired processing effects in particular instances.

In a further step that is optional (block 414 of FIG. 8), the process gas flow rates from process gas supplies 130, 131 to inner and outer gas inlets 130a, 131a (shown in FIG. 6) may be adjusted relative to one another to adjust plasma ion density radial distribution. The adjustments of block 406 (adjusting the relative axial locations of the inner and outer coils 162, 164), block 410 (adjusting the relative RF power levels applied to the inner and outer coils 162, 164) and block 414 (adjusting the relative gas flow rates to the inner and outer gas inlets 131a, 130a) are all symmetrical relative to the vertical axis 190 (FIG. 1) and may be used to render the etch rate distribution (for example) uniform, provided that the etch rate distribution has been transformed to a symmetrical one by the tilting step of block 404.

While the invention has been described in detail by specific reference to preferred embodiments, it is understood that variations and modifications thereof may be made without departing from the true spirit and scope of the invention.

What is claimed is:

1. A method for processing a workpiece in a plasma reactor chamber having radially inner and outer source power applicators at a ceiling of said chamber facing said workpiece, said inner and outer source power applicators and said workpiece sharing a common axis of symmetry, said method comprising:
    applying RF source power to said source power applicators, and introducing a process gas into the reactor chamber so as to carry out a plasma process on said workpiece characterized by a plasma process parameter, said plasma process parameter having a spatial distribution across the surface of said workpiece;
    rotating at least one of (a) said workpiece, (b) said outer source power applicator, about a radial tilt axis to a position at which said spatial distribution of said plasma process parameter has at least a nearly minimal non-symmetry relative to said common axis of symmetry; and
    translating said inner source power applicator relative to said outer source power applicator along said axis of symmetry to a location at which said spatial distribution has at least a nearly minimal non-uniformity across the surface of said workpiece.

2. The method of claim 1 wherein said rotating and translating steps are carried out before said applying step, wherein the optimal amount of rotation and translation is predetermined.

3. The method of claim 1 wherein said rotating step comprises rotating both said workpiece and said outer source power applicator about respective tilt axes.

4. The method of claim 1 wherein said plasma process parameter is etch rate.

5. A method for processing a workpiece in a plasma reactor chamber having radially inner and outer source power applicators at a ceiling of said chamber facing said workpiece, said inner and outer source power applicators and said workpiece sharing a common axis of symmetry, said method comprising:
    applying RF source power to said source power applicators, and introducing a process gas into the reactor chamber so as to carry out a plasma process on said workpiece characterized by a plasma process parameter, said plasma process parameter having a spatial distribution across the surface of said workpiece;
    rotating at least one of: (a) said outer RF source power applicator, (b) said workpiece, about a radial tilt axis to a position at which said spatial distribution of said plasma process parameter has at least a nearly minimal non-symmetry relative to said common axis of symmetry; and
    adjusting the ratio of power levels coupled to a plasma process region overlying said workpiece by said inner and outer source power applicators.

6. The method of claim 5 wherein the step of adjusting the ratio of power levels comprises:
    translating said inner source power applicator relative to said outer source power applicator along said axis of symmetry to a location at which said spatial distribution has at least a nearly minimal non-uniformity across the surface of said workpiece.

7. The method of claim 5 wherein the step of adjusting ratio of power levels comprises:
    adjusting the ratio of RF power levels applied to said inner and outer source power applicators.

8. The method of claim 5 wherein said rotating step comprises rotating both said workpiece and said outer source power applicator about respective tilt axes.

9. The method of claim 5 wherein said rotating and adjusting steps are carried out before said applying step, wherein the optimal amount of rotation and translation is predetermined.

10. The method of claim 5 wherein said plasma process parameter is etch rate.

11. The method for processing a workpiece in a plasma reactor chamber having radially inner and outer source power applicators at a ceiling of said chamber facing said workpiece, said inner and outer source power applicators and said workpiece sharing a common axis of symmetry, said method comprising:
    applying RF source power to said source power applicators, and introducing a process gas into the reactor chamber so as to carry out a plasma process on said workpiece characterized by a plasma process parameter, said plasma process parameter having a spatial distribution across the surface of said workpiece;
    rotating said outer RF source power applicator and said workpiece about respective radial tilt axes to a relative orientation to one another at which said spatial distribution of said plasma process parameter has at least a nearly minimal non-symmetry relative to said common axis of symmetry; and
    adjusting the ratio of power levels coupled to a plasma process region overlying said workpiece by said inner and outer source power applicators.

12. The method of claim 11 wherein the step of adjusting the ratio of power levels comprises:
   translating said inner source power applicator relative to said outer source power applicator along said axis of symmetry to a location at which said spatial distribution has at least a nearly minimal non-uniformity across the surface of said workpiece.

13. The method of claim 11 wherein the step of adjusting ratio of power levels comprises:
   adjusting the ratio of RF power levels applied to said inner and outer source power applicators.

14. The method of claim 11 wherein said rotating and adjusting steps are carried out before said applying step, wherein the optimal amount of rotation and translation is predetermined.

15. The method of claim 11 wherein said plasma process parameter is etch rate.

16. A method for processing a workpiece in a plasma reactor chamber having a source power applicator at a ceiling of said chamber facing said workpiece, said source power applicator and said workpiece sharing a common axis of symmetry, said method comprising:
   applying RF source power to said source power applicator, and introducing a process gas into the reactor chamber so as to carry out a plasma process on said workpiece characterized by a plasma process parameter, said plasma process parameter having a spatial distribution across the surface of said workpiece;
   increasing the symmetry of said spatial distribution relative to said axis by rotating at least one of (a) said workpiece, (b) a radially outer portion of said source power applicator, about a respective radial tilt axis; and
   reducing the non-uniformity of said spatial distribution by changing said spatial distribution symmetrically with respect to said axis.

17. The method of claim 16 wherein the step of reducing the non-uniformity comprises:
   translating a radially inner portion of said source power applicator relative to said outer portion of said source power applicator along said axis of symmetry.

18. The method of claim 16 wherein the step of reducing the non-uniformity comprises:
   adjusting the ratio of RF power levels applied to respective radially inner and outer portions of said source power applicator.

19. The method of claim 16 wherein the step of reducing the non-uniformity comprises:
   adjusting the ratio of flow rates of process gases to radially inner and outer regions of said chamber.

20. The method of claim 16 wherein said process parameter is etch rate.

* * * * *